(12) United States Patent
Mizusawa

(10) Patent No.: US 11,175,231 B2
(45) Date of Patent: Nov. 16, 2021

(54) METHOD FOR EVALUATING CARBON CONCENTRATION

(71) Applicant: SHIN-ETSU HANDOTAI CO., LTD., Tokyo (JP)

(72) Inventor: Yasushi Mizusawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 16/966,700

(22) PCT Filed: Feb. 13, 2019

(86) PCT No.: PCT/JP2019/005006
§ 371 (c)(1),
(2) Date: Jul. 31, 2020

(87) PCT Pub. No.: WO2019/176419
PCT Pub. Date: Sep. 19, 2019

(65) Prior Publication Data
US 2021/0033538 A1    Feb. 4, 2021

(30) Foreign Application Priority Data

Mar. 16, 2018  (JP) .............................. JP2018-048858

(51) Int. Cl.
*G01N 21/64*  (2006.01)
*G01N 21/95*  (2006.01)

(52) U.S. Cl.
CPC ..... *G01N 21/6489* (2013.01); *G01N 21/9501* (2013.01)

(58) Field of Classification Search
CPC ............ G01N 21/6489; G01N 21/9501; H01L 21/26; H01L 21/322; H01L 22/10; H01L 21/26506
See application file for complete search history.

(56) References Cited

U.S. PATENT DOCUMENTS 7,244,306 B2 *   7/2007  Kurita ................... C04B 24/003
                                              117/13
7,279,758 B1 *  10/2007  Li ......................  H01L 21/26506
                                              257/408

(Continued)

FOREIGN PATENT DOCUMENTS

| JP | 2015-111615 A | 6/2015 |
| JP | 2015-156420 A | 8/2015 |
| JP | 2015-222801 A | 12/2015 |

OTHER PUBLICATIONS

Standard test method for substitutional atomic carbon content of silicon by infrared absorption; JEITA EM-3505 Standard of Japan Electronics and Information Technology Industries Association; Nov. 2002; pp. 1-17.

(Continued)

*Primary Examiner* — Marcus H Taningco
(74) *Attorney, Agent, or Firm* — Oliff PLC

(57) ABSTRACT

A method for evaluating a carbon concentration where ions of a predetermined element are implanted into a silicon wafer, and then a carbon concentration is measured by a low-temperature PL method from an emission intensity of a CiCs composite, where the ions are implanted under implantation conditions of $1.1 \times 10^{11} \times$[atomic weight of the implanted element]$^{-0.73}$<implantation amount (cm$^{-2}$)<$4.3 \times 10^{11} \times$[atomic weight of the implanted element]$^{-0.73}$, and the carbon concentration is evaluated. A method for evaluating a carbon concentration makes it possible to measure with high sensitivity, a carbon concentration in a surface layer of 1 to 2 μm, which is a photodiode region in an image sensor.

8 Claims, 4 Drawing Sheets

(56) References Cited

U.S. PATENT DOCUMENTS

| | | | | |
|---|---|---|---|---|
| 11,047,800 | B2* | 6/2021 | Eriguchi | ............ G01N 21/6489 |
| 2014/0379276 | A1* | 12/2014 | Hoshi | .................... G01N 33/00 |
| | | | | 702/23 |
| 2015/0338276 | A1 | 11/2015 | Nakagawa et al. | |
| 2016/0300768 | A1* | 10/2016 | Kamada | .................. H01L 22/12 |

OTHER PUBLICATIONS

Applied Physics; 2015; p. 976-983; vol. 84, No. 11.
Mar. 12, 2019 Search Report issued in International Patent Application No. PCT/JP2019/005006.

* cited by examiner

[FIG. 1]
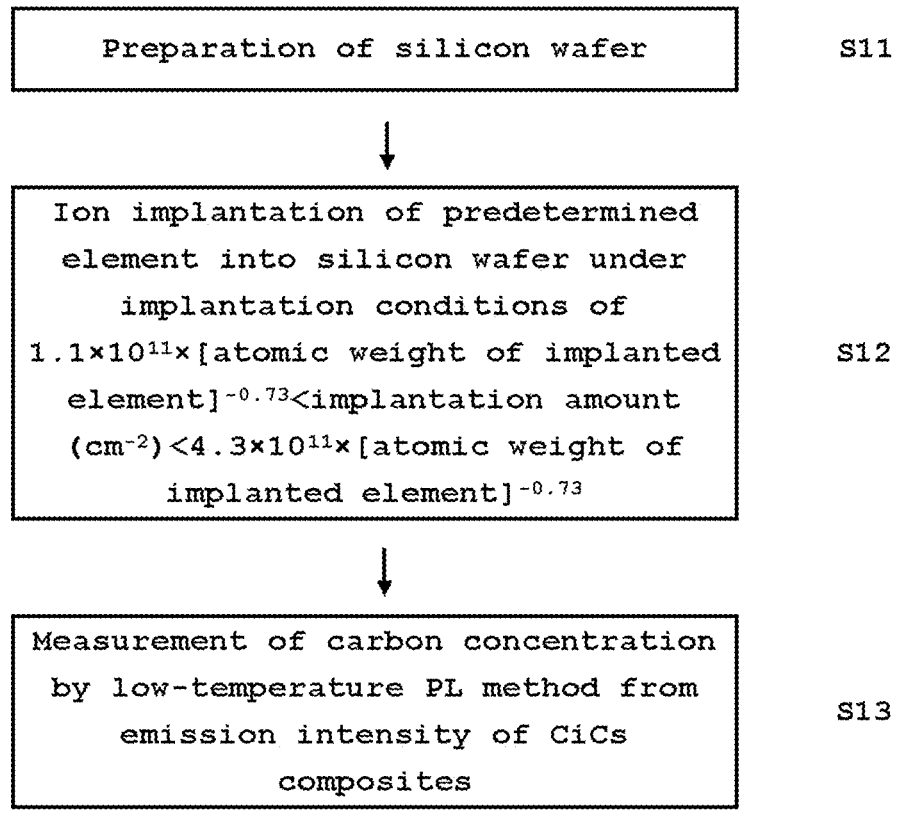
[FIG. 2]
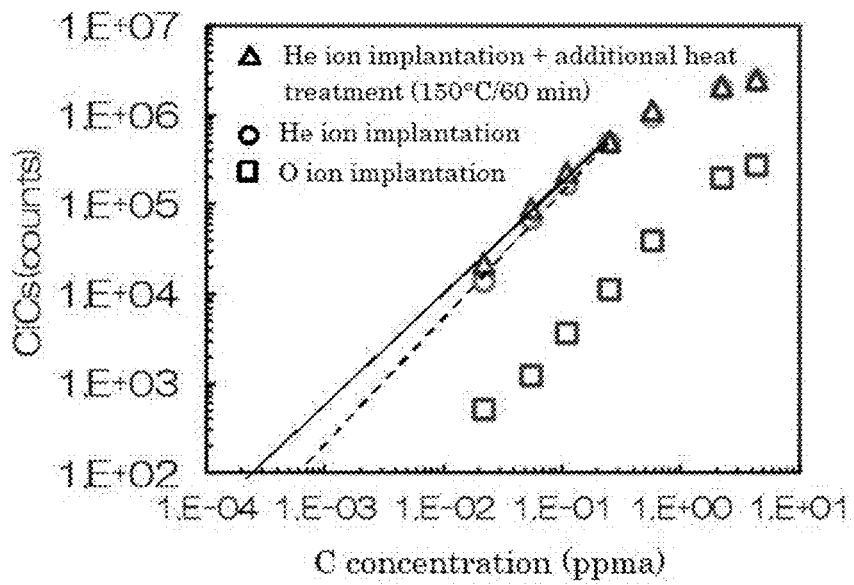

[FIG. 3]
(a)
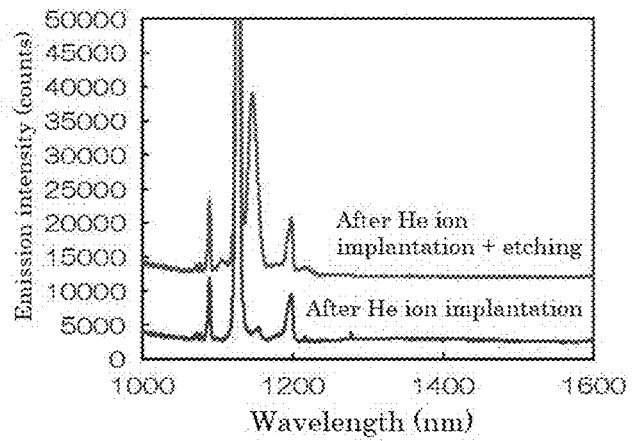
(b)
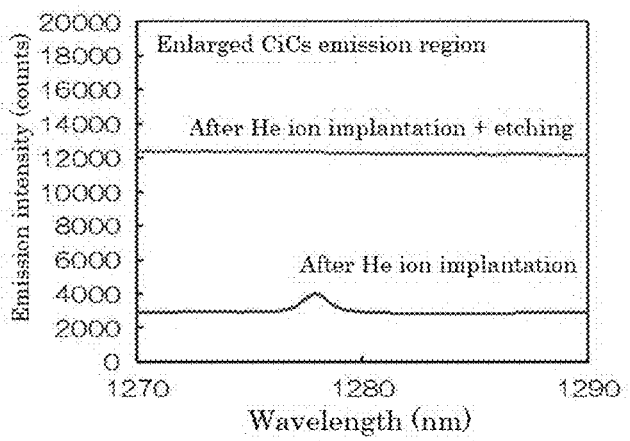
[FIG. 4]
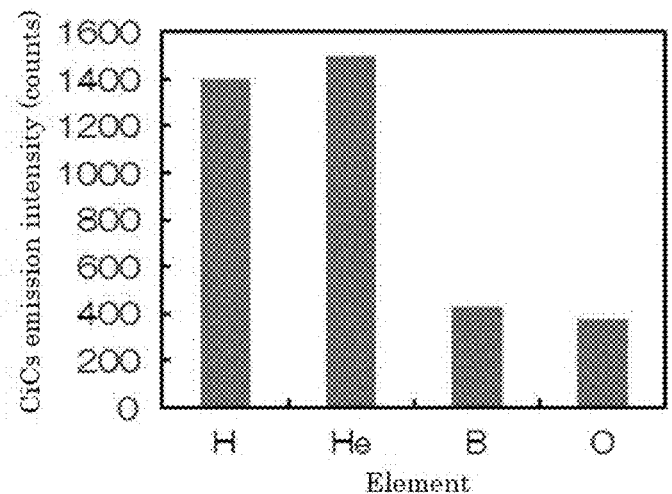

[FIG. 5]
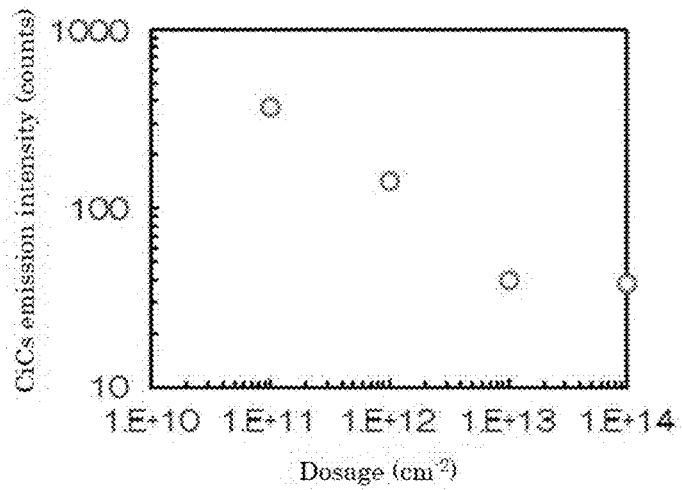
[FIG. 6]
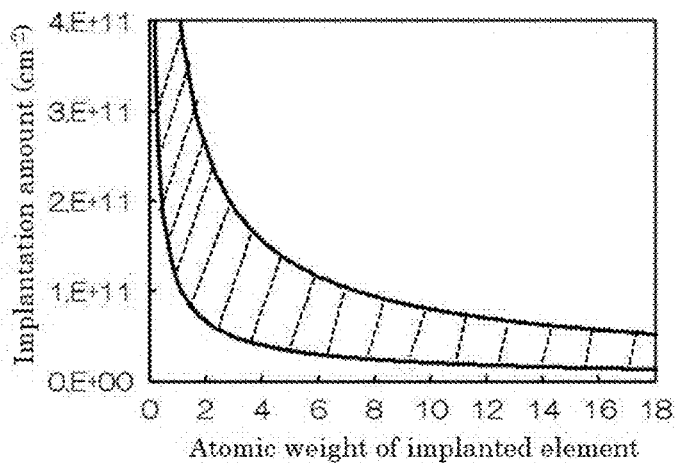
[FIG. 7]
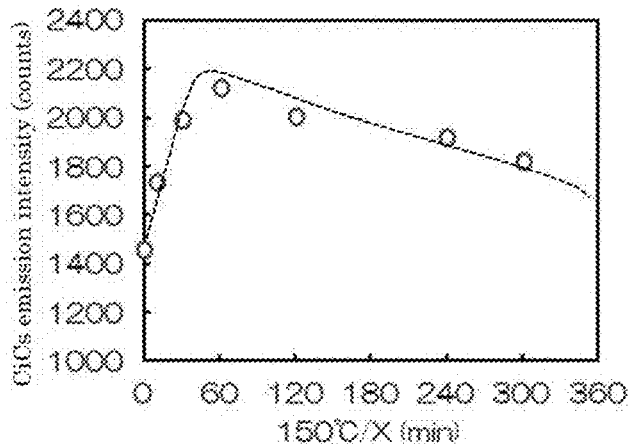

[FIG. 8]
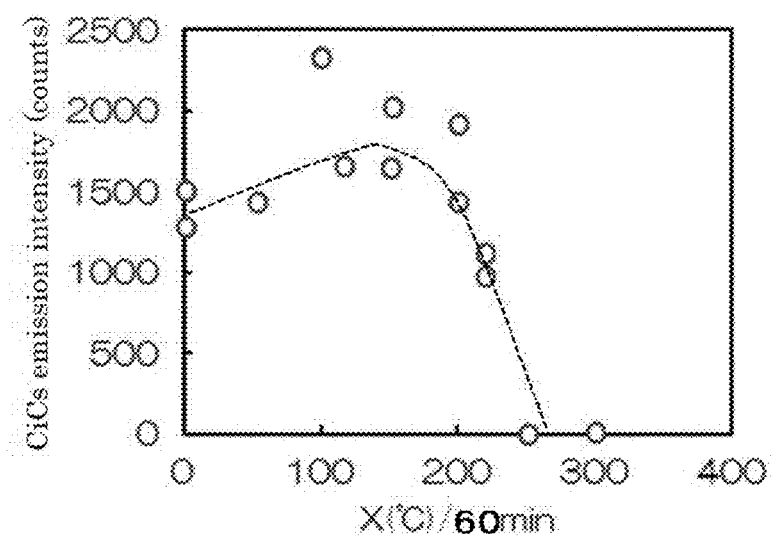

METHOD FOR EVALUATING CARBON CONCENTRATION

TECHNICAL FIELD

The present invention relates to a method for evaluating a carbon concentration.

BACKGROUND ART

As a substrate for fabrication of a semiconductor integrated circuit, a silicon wafer fabricated by a CZ (Czochralski) method is mainly used. Failures in the most advanced image sensors in recent years are considered to be caused by a very small amount of metal impurity in a device active region. Specifically, a metal impurity in a wafer causes a white flaw failure by forming a deep level. Meanwhile, there is an ion implantation process in a device process, and point defects are produced. The point defects that are produced by ion implantation react with carbon in the wafer to form CiCs composites. A CiCs composite forms a level, and therefore, is predicted to be a cause of white flaw failure.

Ways of measuring a carbon concentration in a wafer include an FT-IR method, SIMS, and electron beam irradiation+low-temperature PL measurement.

CITATION LIST

Patent Literature

Patent Document 1: Japanese Unexamined Patent Application Publication No. 2015-222801

Non Patent Literature

Non Patent Document 1: JEITA EM-3503
Non Patent Document 2: Applied Physics, volume 84, No. (2015) p.976

SUMMARY OF INVENTION

Technical Problem

The above-mentioned FT-IR method is a method of transmitting infrared rays into a wafer and quantifying a carbon concentration from an infrared absorption peak in a 1106 $cm^{-1}$ position (Non Patent Document 1). However, analysis by the FT-IR method is an evaluation of the wafer in the entire depth direction since measurement is performed by absorption of transmitted light, and therefore, an outermost surface layer, which is an active layer of a device, cannot be evaluated. Moreover, sensitivity is low and the lower detection limit is approximately 0.03 ppma, which is high.

In the above-mentioned secondary ion mass spectrometry (SIMS), an elemental analysis can be performed by irradiating a sample surface with primary ions and performing a mass spectrometry on emitted secondary ions. Distribution of a carbon concentration in the depth direction can be measured by analysis using SIMS, but the lower detection limit is approximately 0.05 ppma, and analysis of very low carbon is difficult.

The above-mentioned electron beam irradiation+low-temperature PL measurement method is a method in which point defects introduced into a wafer by electron beam irradiation react with carbon to form composites of interstitial carbon and substituted carbon (CiCs composites), and a carbon concentration is quantified by the low-temperature PL method from an intensity of an emission caused by the composites (Non Patent Document 2).

This technique has favorable sensitivity and a low lower detection limit, but CiCs composites are formed in the entire depth direction of the wafer, and CiCs composites that are detected by the low-temperature PL method depend on the diffusion depth of carriers during low-temperature PL measurement. For example, in Non Patent Document 2, the depth is about 10 μm, and a carbon concentration in a shallower region cannot be measured. For example, a surface layer of 1 to 2 μm, which is a photodiode region of an image sensor cannot be evaluated.

In addition, preceding technology for measuring a carbon concentration by ion implantation+PL method includes Patent Document 1, and this is a method for creating a calibration curve for quantification. Furthermore, ion implantation conditions for forming CiCs composites to detect by a low-temperature PL method in measuring the carbon concentration are not optimized in view of measuring the carbon concentration with high sensitivity.

The present invention has been made in view of the above-described problems, and an object thereof is to provide a method for evaluating a carbon concentration that makes it possible to measure with high sensitivity, a carbon concentration in a surface layer of 1 to 2 μm, which is a photodiode region in an image sensor.

Solution to Problem

To achieve the object, the present invention provides a method for evaluating a carbon concentration where ions of a predetermined element are implanted into a silicon wafer, and then a carbon concentration is measured by a low-temperature PL method from an emission intensity of a CiCs composite, wherein the ions are implanted under implantation conditions of $1.1 \times 10^{11} \times$[atomic weight of the implanted element]$^{-0.73}$<implantation amount $(cm^{-2})$<$4.3 \times 10^{11} \times$[atomic weight of the implanted element]$^{-0.73}$, and the carbon concentration is evaluated.

In this manner, the emission intensity of the CiCs composite in a surface layer can be raised by implanting the ions under the implantation conditions of $1.1 \times 10^{11} \times$[atomic weight of the implanted element]$^{-0.73}$<implantation amount $(cm^{-2})$<$4.3 \times 10^{11} \times$[atomic weight of the implanted element]$^{-0.73}$. Therefore, it is possible to measure with high sensitivity, a carbon concentration in a surface layer of 1 to 2 μm, which is a photodiode region in an image sensor. Consequently, a wafer with favorable image sensor characteristics can be selected. In addition, by making it possible to measure the carbon concentration in the surface layer in stages in the middle of the process as well, a contamination state of the carbon concentration in various processes can be grasped easily.

In this event, it is preferable that a recovery heat treatment is performed at a temperature of 200° C. or less after the ions are implanted, and then a carbon concentration is measured by a low-temperature PL method from an emission intensity of a CiCs composite.

By thus performing a recovery heat treatment at a temperature of 200° C. or less after the ions are implanted, the emission intensity of the CiCs composite can be raised more effectively.

In this event, an element to ion-implant into the silicon wafer may be helium or hydrogen.

Such elements can be used suitably as an element to ion-implant into the silicon wafer.

In this event, the carbon concentration is preferably measured in a region within a range of 2 μm or less from a surface of the silicon wafer.

By measuring the carbon concentration of such a region, a carbon concentration in a surface layer of 1 to 2 μm, which is a photodiode region in an image sensor can be measured with high sensitivity, and a wafer with favorable image sensor characteristics can be selected.

Advantageous Effects of Invention

As described above, according to the inventive method for evaluating a carbon concentration, an emission intensity of a CiCs composite can be raised, and therefore, it is possible to measure with high sensitivity, a carbon concentration in a surface layer of 1 to 2 μm, which is a photodiode region in an image sensor. Consequently, a wafer with favorable image sensor characteristics can be selected. In addition, by making it possible to measure the carbon concentration in the surface layer in stages in the middle of the process as well, a contamination state of the carbon concentration in various processes can be grasped easily.

BRIEF DESCRIPTION OF DRAWINGS

FIG. 1 is a flow diagram showing the inventive method for evaluating a carbon concentration.

FIG. 2 is a graph showing the difference in emission intensities of CiCs composites in cases where He ion implantation, He ion implantation+additional heat treatment (150° C./60 min), and O ion implantation were used.

FIG. 3 is a figure showing low-temperature PL spectra before and after etching.

FIG. 4 is a figure showing the emission intensity of CiCs composites in a low-temperature PL measurement after ion implantation of each element.

FIG. 5 is a figure showing dependence of CiCs composite emission intensity on an implantation amount of He ion implantation.

FIG. 6 is a figure showing implantation conditions under which CiCs composite emission intensity becomes high.

FIG. 7 is a graph showing a relation between an additional heat treatment time after ion implantation and CiCs composite emission intensity.

FIG. 8 is a graph showing a relation between an additional heat treatment temperature after ion implantation and CiCs composite emission intensity.

DESCRIPTION OF EMBODIMENTS

Hereinafter, the present invention will be described in detail as an example of an embodiment with reference to the drawings, but the present invention is not limited thereto.

Firstly, it will be explained in the following that after implanting ions, a carbon concentration in a wafer surface layer can be measured by a low-temperature PL method.

Point defects are introduced into a wafer by ion implantation. The introduced point defects react with carbon in the wafer to form CiCs composites. The formed CiCs composites can be detected by the low-temperature PL method, and when a conductivity type is the same, and a resistivity and an oxygen concentration are similar, the carbon concentration can be quantified.

Other than C, point defects also react with oxygen and dopants in the wafer. Accordingly, attention needs to be paid when measuring a carbon concentration in a wafer with a different oxygen concentration or dopant concentration.

In addition, point defects produced by ion implantation can be limited locally. Specifically, a depth region in which point defects are produced can be selected according to an implantation energy of the ion implantation. The depth is approximately a few μm, and the lower the energy, the shallower. Accordingly, the carbon concentration in the wafer surface layer can be measured.

Firstly, an investigation was conducted to confirm that the CiCs composites formed by ion implantation were limited to the surface layer. Ion implantation with an energy such that the range is 0.5 μm (He ion implantation, implantation amount (hereinafter also referred to as dosage): $1\times10^{11}$ $cm^{-2}$, energy: 150 keV) was performed on an n/n-EPW (epitaxial wafer) having an epitaxial layer thickness of 5 μm, and then evaluation was carried out by the low-temperature PL method. Subsequently, a surface layer of 1 μm was removed by etching, and evaluation was once again performed by the low-temperature PL method. The measurement results of the low-temperature PL method before and after the etching are shown in FIG. 3. FIG. 3 (a) shows an entire low-temperature PL spectrum, and FIG. 3 (b) shows an enlarged emission region of the CiCs composites. It was confirmed that emission of CiCs composites (emission that appears around 1278 nm) was not detected after etching.

That is, it was revealed that the carbon that reacts with the point defects that were introduced by the ion implantation performed on this occasion was within a surface layer of 1 μm. From this result, it was revealed that the carbon that is evaluated by an ion implantation+low-temperature PL method is in a surface layer of approximately the range in the ion implantation.

In addition, to quantify the carbon concentration in the surface layer to a low concentration, a high emission intensity of the CiCs composites in the low-temperature PL measurement is advantageous. That is, it is necessary to determine ion implantation conditions that can raise the emission intensity of the CiCs composites.

Next, how the ion implantation conditions (implantation amount) that can raise the emission intensity of the CiCs composites were determined will be explained below.

A plurality of silicon wafers were prepared, ions of H, He, B, and O were implanted into each silicon wafer, and then measurement by the low-temperature PL method was performed. The results are shown in FIG. 4. The implantation amount was $1.0\times10^{11}$ $cm^{-2}$ in every ion implantation. As a result, it was revealed that the emission intensity of the CiCs composite is highest with an ion implantation of He.

Next, ion implantation of He was investigated with different implantation amounts. The specific implantation amounts were $1.0\times10^{11}$ to $1.0\times10^{14}$ $cm^{-2}$. Measurement was performed by the low-temperature PL method. The results are shown in FIG. 5. It was revealed from FIG. 5 that the emission intensity of the CiCs composites becomes higher as the implantation amount becomes lower.

From the above two results, the emission intensity of the CiCs composite with an ion implantation of He at an implantation amount of $1.0\times10^{11}$ $cm^{-2}$ was the highest, and at the same implantation amount, with ion implantation of H, which has a lighter mass than He and causes lower implantation damage, the emission intensity of the CiCs composites becomes somewhat small, but a high emission intensity of the CiCs composites can still be obtained. That is, it has been revealed that optimum ion implantation conditions exist in this region.

Thereupon, the amount of the point defects produced by the ion implantation was estimated using a binary collision simulation software SRIM (http://www.srim.org/). As a result, it was estimated that when He is ion-implanted at an implantation amount of $1.0\times10^{11}$ cm$^{-2}$, the average vacancy concentration in a surface layer of 1 μm is about $1.8\times10^{17}$ cm$^{-3}$, and when H is ion-implanted at an implantation amount of $1.0\times10^{11}$ cm$^{-2}$, the average vacancy concentration in a surface layer of 1 μm is about $1.5\times10^{16}$ cm$^{-3}$. That is, it has been revealed that ion implantation conditions where the average vacancy concentration is within the range of $1.5\times10^{16}$ cm$^{-3}$ to $1.8\times10^{17}$ cm$^{-3}$ are conditions for raising the emission intensity of the CiCs composites. It has been revealed that when the ion implantation conditions that satisfy these conditions are expressed by the atomic weight of the implanted element and the implantation amount, $$1.1\times10^{11}\times[\text{atomic weight of the implanted element}]^{-0.73} < \text{implantation amount (cm}^{-2}) < 4.3\times10^{11}\times[\text{atomic weight of the implanted element}]^{-0.73}$$

holds. When the ions are implanted under the above-described conditions, the emission intensity of the CiCs composites becomes high. This can be shown in a graph as in FIG. 6. In FIG. 6, the shaded region is the region in which the emission intensity of the CiCs composites becomes high (effective region).

A reason for there being optimum ion implantation conditions as described can be considered as follows. To form CiCs composites, introduction of point defects is necessary, but when the amount of the introduced point defects is excessive compared with the carbon concentration, the CiCs composites further react with the point defects, and the emission intensity of the CiCs composites becomes low. Accordingly, it can be presumed that an optimum introduction amount of point defects exists.

Furthermore, it was investigated whether the CiCs emission intensity can be raised by an additional heat treatment. Specifically, after He ion implantation at an implantation amount of $1.0\times10^{11}$ cm$^{-2}$, a heat treatment was performed at 50 to 300° C. for 10 to 300 min, and then, the emission intensity of the CiCs composites was investigated by the low-temperature PL method. The results are shown in FIGS. 7 and 8. From FIGS. 7 and 8, it was revealed that by adding a heat treatment of 150° C./60 min, the emission intensity of the CiCs composite becomes highest. A reason for this can be considered to be that formation of CiCs composites was promoted by the additional heat treatment after the ion implantation. It can be considered that at 250° C. or more, some of the CiCs composites come to be annihilated.

Next, the inventive method for evaluating a carbon concentration will be described in the following with reference to FIG. 1.

FIG. 1 is a flow diagram showing the inventive method for evaluating a carbon concentration.

Firstly, a silicon wafer to be evaluated is prepared (see S11 of FIG. 1).

Next, ions of a predetermined element are implanted into the prepared silicon wafer under implantation conditions of $1.1\times10^{11}\times[\text{atomic weight of the implanted element}]^{-0.73} < \text{implantation amount (cm}^{-2}) < 4.3\times10^{11}\times[\text{atomic weight of the implanted element}]^{-0.73}$ (see S12 of FIG. 1).

The element to ion-implant into the silicon wafer is not particularly limited, but for example, helium or hydrogen is possible.

Such elements can be used suitably as an element to ion-implant into the silicon wafer.

Next, regarding the ion-implanted silicon wafer, the carbon concentration is measured by the low-temperature PL method from the emission intensity of the CiCs composites (see S13 of FIG. 1).

In the carbon concentration measurement in S13 of FIG. 1, a region in a range of 2 μm or less from the surface of the silicon wafer is preferably measured.

By measuring the carbon concentration of such a region, a carbon concentration in a surface layer of 1 to 2 μm, which is a photodiode region in an image sensor can be measured with high sensitivity, and a wafer with favorable image sensor characteristics can be selected. Note that the region to measure the carbon concentration can be any region as long as it is in the range of 2 μm or less from the surface of the silicon wafer, and the lower limit thereof can be 0 μm (the surface of the silicon wafer).

After implanting the ions in S12 of FIG. 1, it is preferable to perform a recovery heat treatment at a temperature of 200° C. or less, and then perform the carbon concentration measurement of S13 of FIG. 1.

By thus performing a recovery heat treatment at a temperature of 200° C. or less after the ions are implanted, the emission intensity of the CiCs composite can be raised more effectively. Note that the recovery heat treatment can be performed at a temperature of 50° C. or more and 200° C. or less, for example.

According to the inventive method for evaluating a carbon concentration described above, the emission intensity of the CiCs composites in the surface layer can be raised, and therefore, it is possible to measure with high sensitivity, the carbon concentration in the surface layer of 1 to 2 μm, which is a photodiode region in an image sensor. Consequently, a wafer with favorable image sensor characteristics can be selected. In addition, by making it possible to measure the carbon concentration in the surface layer in stages in the middle of the process as well, a contamination state of the carbon concentration in various processes can be grasped easily.

EXAMPLE

Hereinafter, the present invention will be described more specifically with reference to Examples and Comparative Examples, but the present invention is not limited thereto.

Example 1

Ions of He were implanted into n-type silicon epitaxial wafers having varied C concentrations in an epitaxial layer at an implantation amount of $1\times10^{11}$ cm$^{-2}$, and then an emission intensity of a CiCs composite was measured by a low-temperature PL method.

Note that the atomic weight of He is 4, and the above implantation amount was within the range of $1.1\times10^{11}\times[\text{atomic weight of the implanted element}]^{-0.73} = 3.99\times10^{10} < \text{implantation amount (cm}^{-2}) < 4.3\times10^{11}\times[\text{atomic weight of the implanted element}]^{-0.73} = 1.56\times10^{11}$.

In addition, in a case where ions were implanted under the same conditions as those described above and then a further heat treatment was performed at 150° C./60 min, the emission intensity of the CiCs composite was measured by the low-temperature PL method.

Next, the carbon concentration in the epitaxial layer of these silicon epitaxial wafers was measured by SIMS.

A calibration curve of the carbon concentration was then created from the relation between the emission intensity of the CiCs composite and the carbon concentration obtained from these measurement results (see FIG. 2).

These carbon concentrations show from the ion implantation conditions, the carbon concentrations at approximately 1 μm from the surface layer, and it was revealed that it becomes possible to measure carbon concentrations of less than 0.002 ppma (see FIG. 2). Furthermore, the emission intensity of the CiCs composites became somewhat higher when the heat treatment was performed (see FIG. 2). Thus, it was confirmed that the sensitivity of carbon concentration detection becomes even higher by performing a heat treatment.

Comparative Example 1

Ions of O were implanted into n-type silicon epitaxial wafers having varied C concentrations in an epitaxial layer at an implantation amount of $1 \times 10^{11}$ cm$^{-2}$, and then an emission intensity of a CiCs composite was measured by the low-temperature PL method.

Next, the carbon concentration in the epitaxial layer of these silicon epitaxial wafers was measured by SIMS.

A calibration curve of the carbon concentration was then created from the relation between the emission intensity of the CiCs composite and the carbon concentration obtained from these measurement results (see FIG. 2).

These carbon concentrations show from the ion implantation conditions, the carbon concentrations at approximately 1 μm from the surface layer. Compared with the cases in Example 1, where ions of He were implanted, the emission intensity of the CiCs composites was small, sensitivity of carbon concentration detection was poor, and it was revealed that the carbon concentration in the surface layer of the epitaxial layer less than 0.02 ppma cannot be measured (see FIG. 2).

In this event, to obtain a calibration curve by which carbon concentrations of less than 0.002 ppma can be measured, the implantation amount needs to be $1.45 \times 10^{10}$ ($=1.1 \times 10^{11} \times$[atomic weight of the implanted element]$^{-0.73}$) cm$^{-2}$<implantation amount <$5.68 \times 10^{10}$ ($=4.3 \times 10^{11} \times$[atomic weight of the implanted element]$^{-0.73}$) cm$^{-2}$, since the atomic weight of O is 15.99.

Example 2 and Comparative Examples 2 and 3

The range of the dosage (implantation amount) of the He ion implantation in the present invention is $4 \times 10^{10}$ cm$^{-2}$<dosage (implantation amount)<$1.6 \times 10^{11}$ cm$^{-2}$, since the atomic weight of He is 4.

Accordingly, in the same manner as in Example 1, He ions were implanted into n/n$^-$EPWs (epitaxial wafers) at a dosage of $3 \times 10^{10}$ (Comparative Example 2), $5 \times 10^{10}$ (Example 2), and $5 \times 10^{11}$ (Comparative Example 3) cm$^{-2}$, and then the emission intensity of a CiCs composite was measured by the low-temperature PL method.

As a result, assuming that the emission intensity of the CiCs composite was 1 when the dosage was $1 \times 10^{11}$ cm$^{-2}$ (Example 1), the emission intensity was 0.6 with a dosage of $3 \times 10^{10}$ cm$^{-2}$, 0.98 with a dosage of $5 \times 10^{10}$ cm$^{-2}$, and 0.4 with a dosage of $5 \times 10^{11}$ cm$^{-2}$.

From the above results, it was shown that the emission intensity of CiCs composites becomes high with a dosage (implantation amount) in the range of the present invention.

A reason why the emission intensity of CiCs composites becomes low when the dosage is low is that the amount of point defects necessary for the carbon in a measurement region to form CiCs composites is insufficient. Meanwhile, a reason why the emission intensity of CiCs composites becomes low when the dosage is too high is that the amount of point defects introduced by implantation becomes excessive and CiCs composites and point defects react, lowering the concentration of the CiCs composites.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for evaluating a carbon concentration where ions of a predetermined element are implanted into a silicon wafer, and then a carbon concentration is measured by a low-temperature PL method from an emission intensity of a CiCs composite, wherein
   the ions are implanted under implantation conditions of $1.1 \times 10^{11} \times$[atomic weight of the implanted element]$^{-0.73}$<implantation amount (cm$^{-2}$)<$4.3 \times 10^{11} \times$ [atomic weight of the implanted element]$^{-0.73}$, and the carbon concentration is evaluated.

2. The method for evaluating a carbon concentration according to claim 1, wherein a recovery heat treatment is performed at a temperature of 200° C. or less after the ions are implanted, and then a carbon concentration is measured by a low-temperature PL method from an emission intensity of a CiCs composite.

3. The method for evaluating a carbon concentration according to claim 2, wherein an element to ion-implant into the silicon wafer is helium or hydrogen.

4. The method for evaluating a carbon concentration according to claim 3, wherein the carbon concentration is measured in a region within a range of 2 μm or less from a surface of the silicon wafer.

5. The method for evaluating a carbon concentration according to claim 2, wherein the carbon concentration is measured in a region within a range of 2 μm or less from a surface of the silicon wafer.

6. The method for evaluating a carbon concentration according to claim 1, wherein an element to ion-implant into the silicon wafer is helium or hydrogen.

7. The method for evaluating a carbon concentration according to claim 6, wherein the carbon concentration is measured in a region within a range of 2 μm or less from a surface of the silicon wafer.

8. The method for evaluating a carbon concentration according to claim 1, wherein the carbon concentration is measured in a region within a range of 2 μm or less from a surface of the silicon wafer.

* * * * *